(12) United States Patent
Mishiro

(10) Patent No.: US 7,321,099 B2
(45) Date of Patent: Jan. 22, 2008

(54) COMPONENT MOUNTING SUBSTRATE AND STRUCTURE

(75) Inventor: Kinuko Mishiro, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/921,196

(22) Filed: Aug. 19, 2004

(65) Prior Publication Data
US 2005/0224252 A1      Oct. 13, 2005

(30) Foreign Application Priority Data
Apr. 9, 2004  (JP) ............................ 2004-114985

(51) Int. Cl.
*H05K 1/16* (2006.01)

(52) U.S. Cl. ...................... 174/260; 174/262

(58) Field of Classification Search ................ 174/260, 174/261, 257, 255, 262; 361/760; 257/778, 257/687, 787; 438/127, 125, 126
See application file for complete search history.

(56) References Cited

U.S. PATENT DOCUMENTS

| | | | | |
|---|---|---|---|---|
| 5,126,820 | A | * | 6/1992 | Brown ........................ 257/420 |
| 5,828,116 | A | * | 10/1998 | Ao ............................. 257/417 |
| 6,097,089 | A | * | 8/2000 | Gaku et al. .................. 257/712 |
| 6,153,930 | A | * | 11/2000 | Hori ............................ 257/687 |
| 6,384,472 | B1 | * | 5/2002 | Huang ......................... 257/680 |
| 6,562,660 | B1 | * | 5/2003 | Sakamoto et al. ........... 438/124 |
| 6,703,696 | B2 | * | 3/2004 | Ikenaga et al. ............. 257/678 |
| 6,787,923 | B2 | * | 9/2004 | Tan et al. .................... 257/779 |
| 2001/0045626 | A1 | * | 11/2001 | Hirose ......................... 257/666 |

FOREIGN PATENT DOCUMENTS

| | | |
|---|---|---|
| JP | 60-140782 | 7/1985 |
| JP | 5-226792 | 9/1993 |
| JP | 9-63912 | 3/1997 |
| JP | 2000-277923 | 10/2000 |
| JP | 2001-332646 | 11/2001 |
| JP | 2003-124389 | 4/2003 |
| JP | 2003273479 A * | 9/2003 |
| WO | WO2004026010 A1 * | 3/2005 |

* cited by examiner

*Primary Examiner*—Ishwar (I. B.) Patel
(74) *Attorney, Agent, or Firm*—Westerman, Hattori, Daniels & Adrian, LLP.

(57) ABSTRACT

To provide a component mounting substrate and a component mounting structure which absorb stresses caused by impact or by the difference in the thermal extension coefficient between substrate and component, without increasing the required accuracy in soldering the substrate and the component together. The substrate, which is to be mounted with a component having one or more solder joints via which the component is connected to the substrate, has a depressed part thereof formed on its component side, on which one or more electrodes are provided to be closely joined with the solder joints. The depressed part is filled with a filling material with rigidity different from that of a material making up the substrate body, such that the filling material is flush or almost flush with the surface of the component side of the substrate.

8 Claims, 8 Drawing Sheets

COMPONENT MOUNTING SUBSTRATE AND STRUCTURE

BACKGROUND OF THE INVENTION

1. Field of the Invention

The present invention relates to component mounting substrates on which components such as BGA (Ball Grid Array) and LGA (Land Grid Array) packages are mounted by use of solder joints.

2. Description of the Related Art

Generally speaking, a QFP (Quad Flat Package) has terminals (lead pins) on its package sides, which terminals are to be soldered to a substrate, thereby establishing connection between the QFP and the substrate. In addition, such lead pins can absorb drop impact applied to the package and substrate as well as a stress caused by a thermal expansion difference between the substrate and the component.

With recent demand for downsized components and devices, integrated circuit packages (hereinafter also called "components") such as BGA (Ball Grid Array) packages and LGA (Land Grid Array) packages having no such lead pins formed thereon have been increasingly used. Such BGA and LGA packages have solder joints, or so-called balls or lands, projecting from the undersurface of their packages, through which solder joints the packages are mounted and connected to substrates (printed board; component mounting substrate).

Although components are connected to substrates by use of solder joints (balls or lands), this connection is nevertheless not so different from direct connection, in which components are directly connected to substrate. This makes it difficult to absorb drop impact or the like applied to the components, and to absorb stress applied thereto by temperature change, such stress being caused by a difference in thermal expansion rate (thermal expansion coefficient) between the substrates and the components.

Accordingly, such substrates on which BGA or LGA packages are mounted are susceptible to drop impact and temperature change, so that damages such as solder cracks and exfoliation of electrodes are likely to happen at connections (soldered parts) between the substrates and the components. This disadvantage lowers the reliability of such component mounted substrates.

FIG. 7 and FIG. 8 are cross-sectional views showing a previous component mounting substrate and a previous component mounting structure. The substrate 1 of FIG. 7 and FIG. 8 is mounted with a component (BGA in this example) 4 having no terminals (lead pins) to be soldered, and on the component side of the substrate 1 there are formed a substrate resist 3 and substrate electrodes 2. The component 4 is provided with component electrodes 5 having solder joints (balls) 7 that are to be soldered to the substrates electrodes 2 of the substrate 1, and the solder joints 7 and the substrate electrodes 2 are joined together with solder, whereby connection between the substrate 1 and the component 4 is established. Here, the component 4 also has a component resist 6 formed on a side thereof which is joined with the substrate 1.

In order to increase the aforementioned reliability of the component mounting structure, resin 8 is filled into a gap between the substrate 1 and the component 4, as shown in FIG. 7, to reinforce the structure, or hardware 9 is arranged around the component 4, as shown in FIG. 8, to increase the apparent rigidity of the substrate 1, thereby minimizing warp of the substrate 1.

For the purpose of absorbing a stress applied to the substrate 1 and the component 4 by impact or by the difference in the thermal expansion rate between the substrate 1 and the component 4, the following techniques have been developed:

[Patent Application 1] Japanese Patent Application Publication No. 2000-277923;

[Patent Application 2] Japanese Patent Application Publication No. 2003-124389; and

[Patent Application 3] Japanese Patent Application Publication No. 2001-332646.

The patent application 1 discloses a BGA package having solder electrodes that are formed as projections made of resin; the patent application 2 discloses grooves that are formed around electrodes on the component side of the substrate; the patent application 3 discloses grooves that are formed around electrodes on the side of the substrate opposite the component side.

With recent demands for downsizing (in weight, thickness, and size) of so-called mobile products such as mobile phones and PDAs (Personal Digital Assistants), demand for downsizing of component mounting substrates for use in such downsized mobile products has grown.

However, in accordance with the previous arts of FIG. 7 and FIG. 8, since use of resin 8 and mounting hardware 9 increases both the weight and the height of the package, the aforementioned demand for weight-reduction and thickness-reduction will not be satisfied. Moreover, the techniques of FIG. 7 and FIG. 8 do not satisfy the aforementioned size-reduction demand, either, because the resin 8 often slightly leaks from the gap between the substrate 1 and the component 4 in the technique of FIG. 7, and because a space to install the mounting hardware is required in the technique of FIG. 8.

In order to improve the rigidity of the substrate itself, it is conceivable to use an inorganic substrate such as a ceramic board or to increase the thickness of the substrate. However, since both of these methods significantly increase the weight of the substrate, they are not suitable for use in downsized mobile products.

In the patent application 1, demands for weight reduction and thickness reduction in substrates are satisfied. However, the projection-like shape of the substrate electrodes of this application causes the following problem. When the substrate electrodes and the solder joints are joined together with solder, solder must be supplied to the projections with high accuracy. This not only makes the solder supply process difficult but also necessitates high accuracy in joining the component and the solder.

Solder print is normally used to supply solder for joining a component and a substrate, and such solder print is often displaced several μm to 150 μm. In addition, at the time of joining a component and a substrate, the component is pushed against the substrate, whereby solder put on the substrate electrodes slightly spreads over the component side of the substrate, and is resultantly deformed.

Accordingly, in the art of the patent application 1, even slight displacement of solder supply can cause the supplied solder to come off the projection parts. In such cases, the adhesive strength between the component and the substrate is deteriorated, thereby also affecting solder connection.

Similarly, in the art of the patent application 2, grooves formed around substrate electrodes deteriorate tolerances on solder supply positions and component connections, thereby making solder connection difficult. In addition, if solder is applied to positions shifted from the proper positions in the patent application 2, the solder will flow into the grooves formed around the substrate electrodes, thereby making it impossible to perform solder connection with reliability. This will necessitate performance of more accurate soldering processing. Moreover, the solder filled into the grooves will also affect absorption of the aforementioned applied stresses.

Further, since the art of the patent application 3 provides grooves only on the side of the substrate opposite the component side, it is impossible to absorb a stress applied to the joints (that is, solder part) between the substrate and the component, at which joint cracks and exfoliation of the electrodes are likely to occur.

SUMMARY OF THE INVENTION

With the foregoing problems in view, it is an object of the present invention to provide a component mounting substrate and a component mounting structure which absorb stresses caused by impact or by the difference in the thermal extension coefficient between substrate and component, without increasing the required accuracy in soldering substrate and component together.

In order to accomplish the above object, according to the present invention, there is provided a substrate for mounting thereon a component having one or more solder joints, via which the component is adapted to be connected to the substrate, which substrate comprises: a substrate body with a depressed part thereof formed on a component side thereof, on which side one or more electrodes are provided to come into close contact with the solder joints; and a filling made of a filling material with rigidity different from that of a material making up the substrate body, the filling being filled into the depressed part so as to be flush or almost flush with the surface of the component side.

As a preferred feature, the substrate body has another depressed part formed on a side thereof opposite the component side, the last-mentioned depressed part being filled with a filling made of the filling material in such a manner that the filling is flush or almost flush with a surface of the opposite side.

As a generic feature, there is provided a substrate for mounting thereon a component having one or more solder joints, via which the component is adapted to be connected to the substrate, which substrate comprises: a substrate body with a depressed part thereof formed on a component side thereof, on which side one or more electrodes are provided to come into close contact with the solder joints; and a filling made of a material with a thermal expansion coefficient intermediate between a thermal expansion coefficient of a material making up the component and that of a material making up the substrate body, the filling being filled into the depressed part so as to be flush or almost flush with the surface of the component side.

As another generic feature, there is provided a component mounting structure, comprising: a component having one or more solder joints; and a substrate for mounting thereon the component, which is connected to the substrate via the solder joints. The substrate includes: a substrate body with a depressed part thereof formed on a component side thereof, on which side one or more electrodes are provided to come into close contact with the solder joints of the component; and a filling made of a filling material with a thermal expansion coefficient intermediate between a thermal expansion coefficient of a material making up the component and that of a material making up the substrate body, the filling being filled into the depressed part so as to be flush or almost flush with a surface of the component side.

As a preferred feature, the component has a member placed on a side thereof which faces the component side of the substrate body, the member being made of the filling material with the thermal expansion coefficient intermediate between the thermal expansion coefficient of the material making up the component and that of the material making up the substrate body.

As another preferred feature, the component has a depressed part thereof formed on a side thereof which faces the component side of the substrate body, the last-mentioned depressed part being filled with a filling, which is made of the filling material having the thermal expansion coefficient intermediate between the thermal expansion coefficient of the material making up the component and that of the material making up the substrate body.

As still another preferred feature, the depressed part is formed on the component side of the substrate body so as to surround one or more of the electrodes provided thereon.

As a further preferred feature, the filling material can have rigidity higher than that of the material of the substrate body. An epoxy resin is a preferred example material.

As a furthermore preferred feature, the filling material can have rigidity lower than that of the material of the substrate body. A silicon resin is a preferred example material.

As a further preferred feature, the filling material contains a predetermined amount of filler that is mixed therein to adjust the thermal expansion coefficient of the filling material.

The component mounting substrate of the present invention guarantees the following advantageous results.

The substrate has a depressed part thereof formed on its component side, and the depressed part is filled with material having rigidity different from the rigidity of the substrate. This arrangement is capable of absorbing a stress such as drop impact applied to the substrate, so that cracks in joints (solder part) between the substrate and the component or exfoliation of the joints are prevented.

Further, at the time of soldering a component to the substrate, if solder is applied to positions slightly shifted from proper positions due to inaccurate solder print, the supplied solder can spread over the depressed part. Even in such a case, since the filling material is filled into the depression so as to be flush or almost flush with the surface of the component side, the solder is prevented from entering the depression so that the soldering processing is carried out with reliability. Thus, the above applied stress will be absorbed without increasing the required accuracy in the soldering processing.

Further, since the material filled into the depressions has greater rigidity than the substrate, the rigidity of the substance is resultantly increased. That is, the filling material absorbs drop impact or the like applied to the substrate, so that cracks in joints (solder part) between the substrate and the component and exfoliation of the joints are prevented.

Still further, if the material filling the depressions has lower rigidity than the substrate, this material absorbs drop impact or the like so that cracks in joints (solder part) between the substrate and the component and exfoliation of the joints are prevented.

Furthermore, such depressions are also formed on a side of the component that faces the component side of the substrate, and the aforementioned material is also filled into the depressions. This arrangement will also prevent cracks in joints (solder part) between the substrate and the component and exfoliation of the joints, without increasing the demanded accuracy in the soldering processing.

Moreover, according to the component mounting substrate and the component mounting structure of the present embodiment, since the material filling the depressions on the component side of the substrate has a thermal expansion coefficient intermediate between the thermal expansion coefficient of the component and that of the substrate, a stress caused by temperature change between the substrate and the component, each having a different thermal expansion coefficient, will be absorbed, so that cracks in joints (solder part) between the substrate and the component and exfoliation of the joints are prevented.

In addition, in accordance with the component structure of the present embodiment, since a material having a thermal expansion coefficient intermediate between the thermal expansion coefficient of the component and the substrate is mounted on or embedded in the side of the component that faces the component side of the substrate, a stress caused by temperature change between the substrate and the component, each having a different thermal expansion coefficient, will be absorbed with greater certainty.

Other objects and further features of the present invention will be apparent from the following detailed description when read in conjunction with the accompanying drawings.

DESCRIPTION OF THE PREFERRED
EMBODIMENT(S)

Embodiments of the present invention will now be described with reference to the accompanying drawings.

(1) First Embodiment

Figure 1:
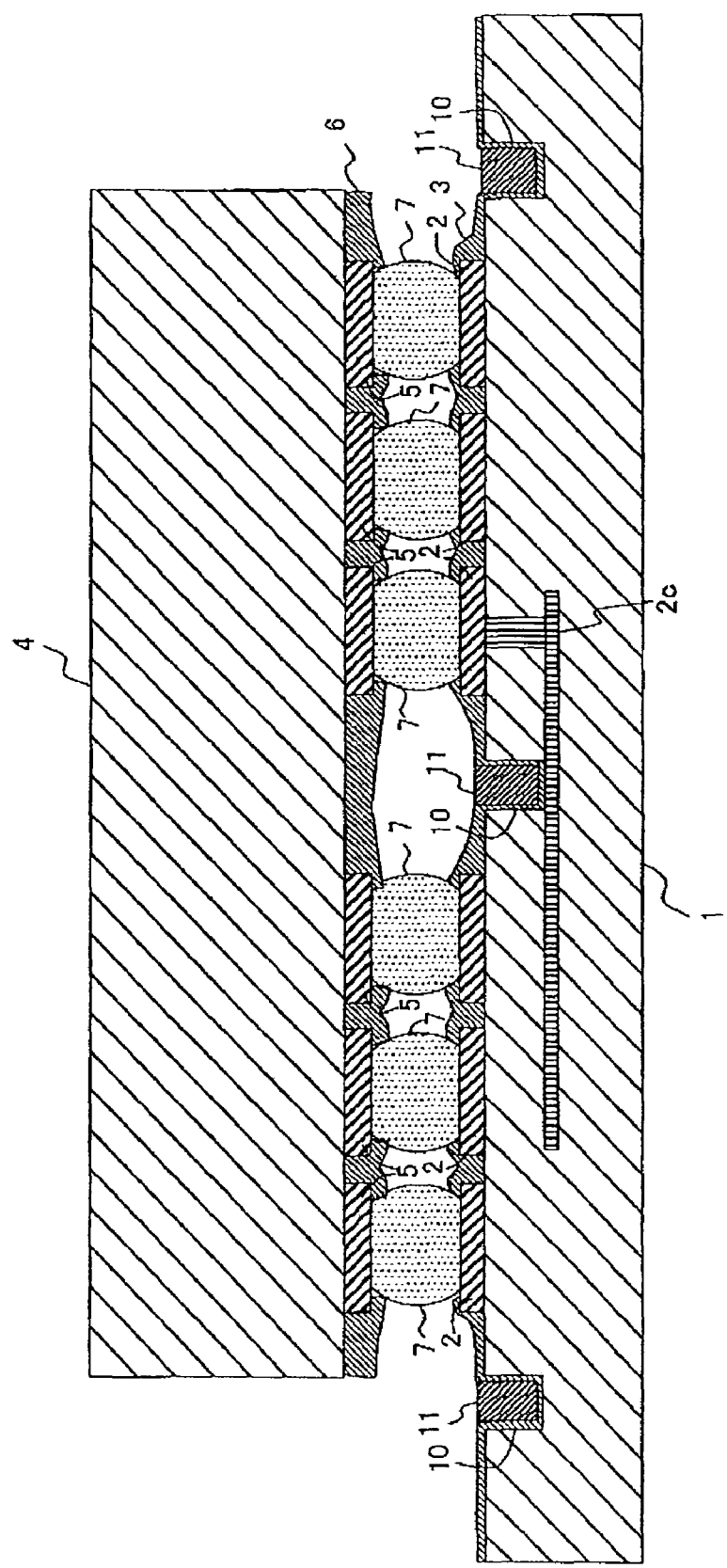
FIG. 1 is a cross-sectional view showing a substrate on which a component is mounted and a component mounting structure according to a first embodiment of the present invention.

A description will be made hereinbelow of a component mounting substrate and a component mounting structure of a first embodiment of the present invention. FIG. 1 is a cross-sectional view of constructions of the component mounting substrate and the component mounting structure of the first embodiment. Like reference numbers and characters designate similar parts or elements throughout several views of the present embodiment and the conventional art, so their detailed description is omitted here.

Figure 7:
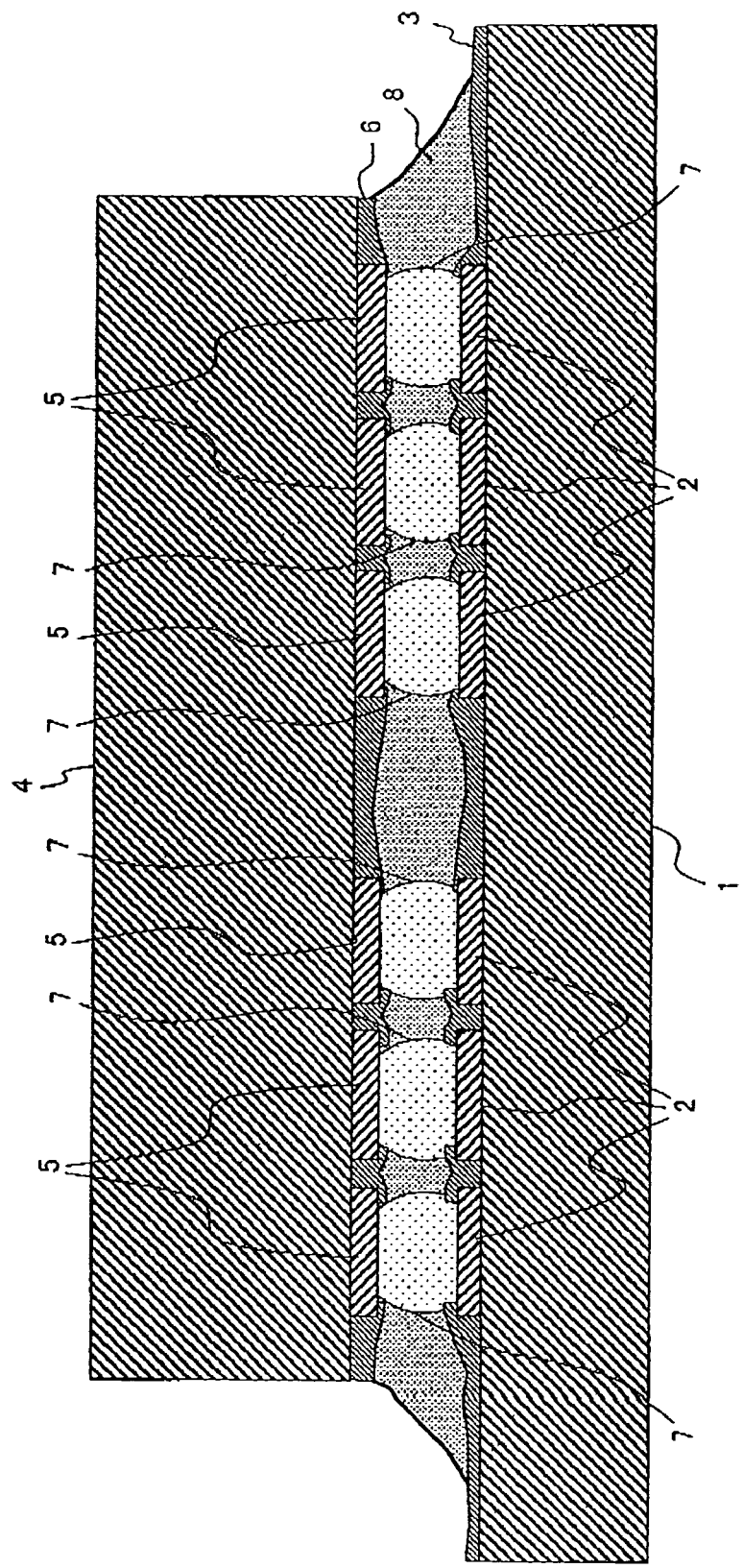
FIG. 7 is a cross-sectional view showing a previous substrate on which a component is mounted and a previous component mounting structure.
Figure 8:
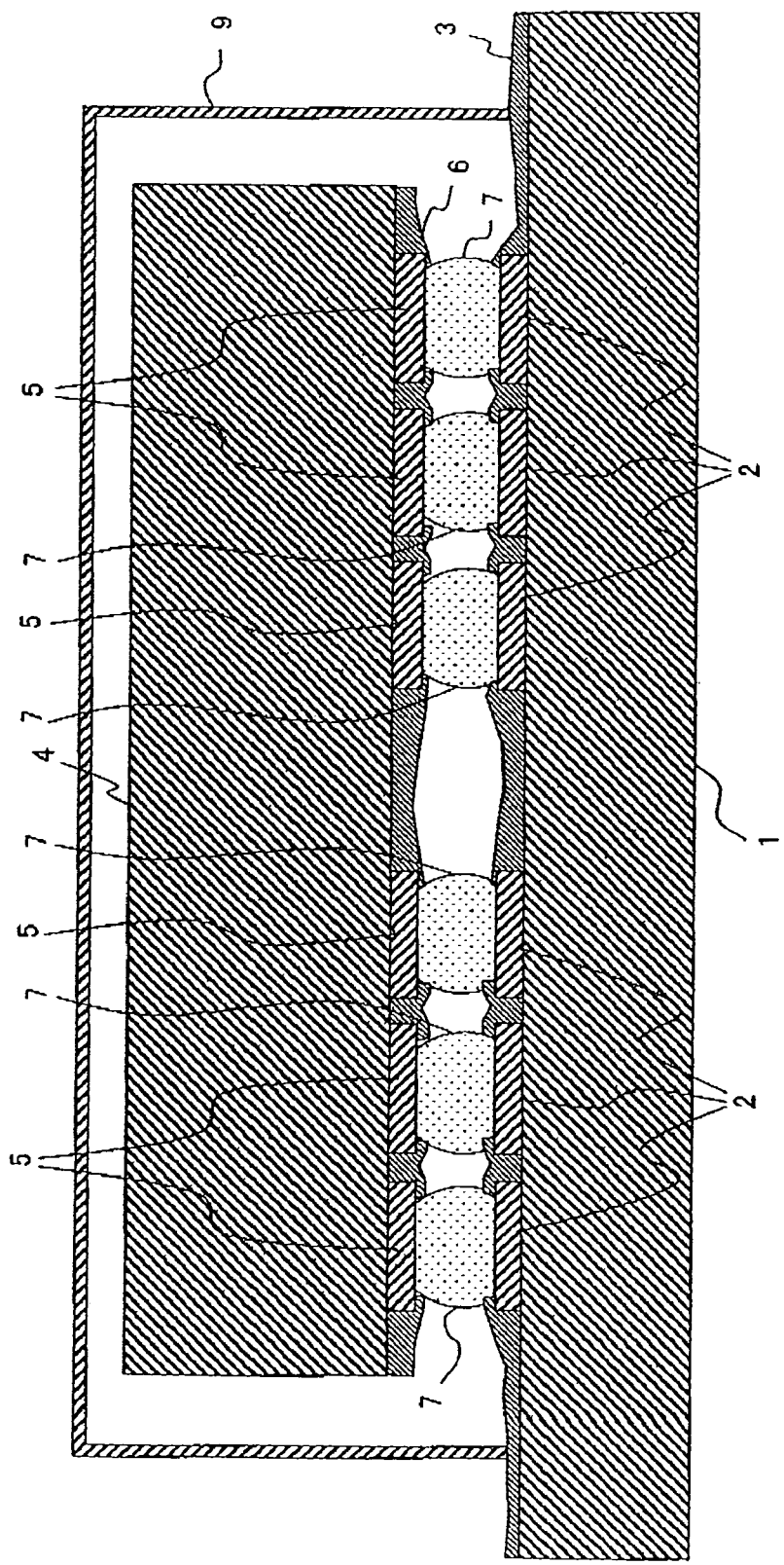
FIG. 8 is a cross-sectional view showing another previous substrate on which a component is mounted and another previous component mounting structure.

As shown in FIG. 1, in the component mounting substrate and the component mounting structure of the first embodiment, substrate electrodes 2 (see FIG. 2) are arranged on the surface of a component side, on which a component 4 is to be mounted, of the substrate (substrate body) 1 at positions corresponding to solder joints (balls) 7 provided on the undersurface of the component 4, and a substrate resist 3 is formed on the surface of the component side. Further, an inner layer wiring 2c connected to the substrate electrodes 2 is provided on a layer lower than the component-side surface of the substrate 1. Since the component 4 has the same construction as that of the previous components already described with reference to FIG. 7 and FIG. 8, its details are omitted here.

The substrate electrodes 2 and the solder joints (balls) 7 are closely soldered together, whereby the substrate 1 and the component 4 are connected.

Further, in the component mounting substrate and the component mounting structure of the first embodiment, a depressed part 10 having a groove-like shape is formed on the component-side surface, dividing the substrate electrodes 2 into groups, and the depressed part 10 is filled with a filling 11 (will be detailed later), which is made of a material with a property different from the property of the material making up the substrate 1, such that the filling 11 is flush or almost flush with the component-side surface of the substrate 1.

Figure 2:
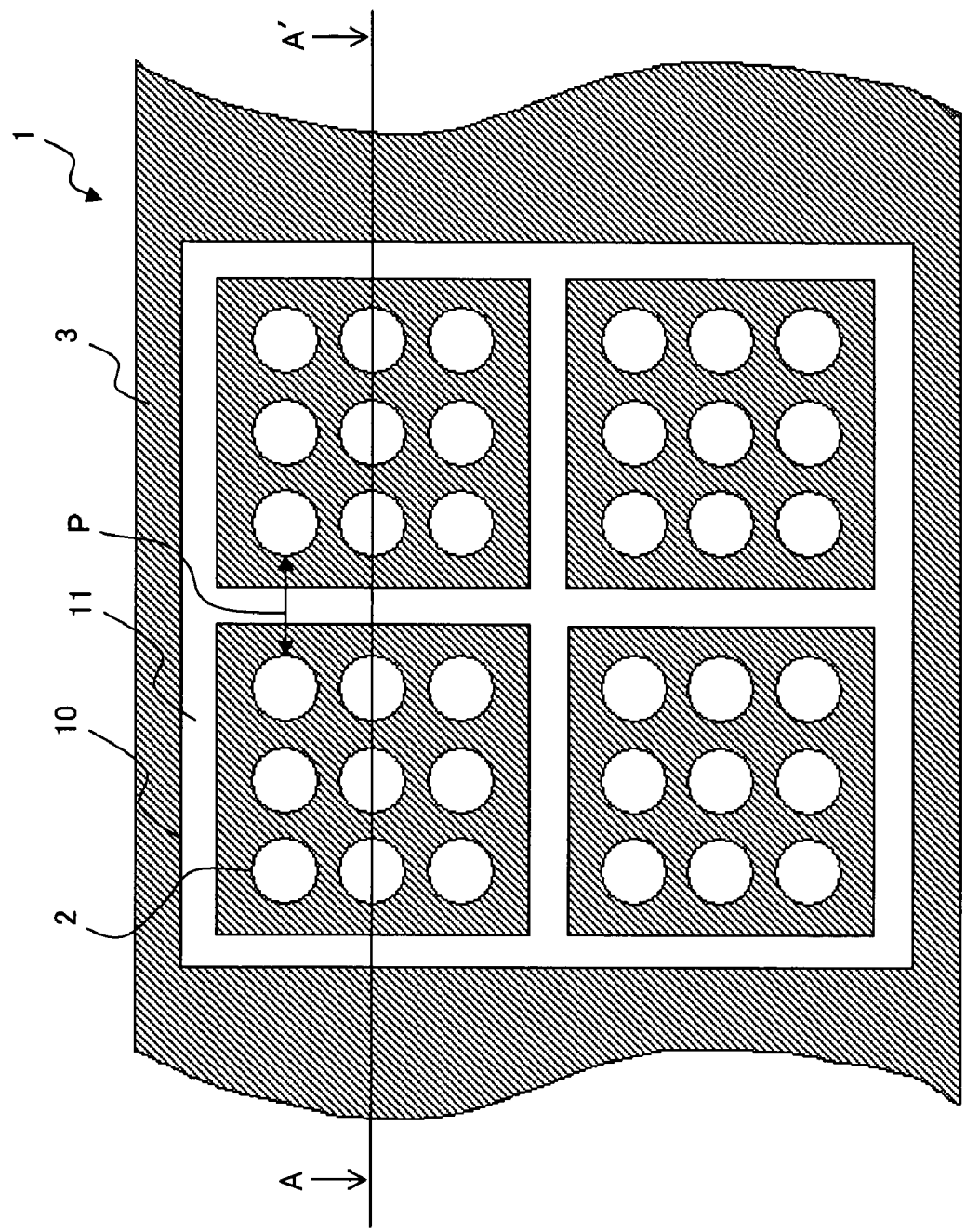
FIG. 2 is a plan view showing a component side of the substrate of FIG. 1 on which components are to be mounted.

FIG. 2 is a plan view of the component-side surface of the component mounting substrate according to the first embodiment. As shown in FIG. 2, the depressed part 10, which is formed so as to surround groups of 3×3 substrate electrodes 2, is filled with the filling 11. Note that the cross-section of the substrate 1 of FIG. 1 is taken from section A-A' of FIG. 2.

The depressed part 10 of the substrate 1 is created with a laser in a manner similar to the manner in which via holes are formed thereon, or alternatively, the depressed part 10 can be punched before lamination of the substrate 1 is performed. Here, most substrates 1 that are employed in mobile products are organic substrates such as build-up boards and glass epoxy boards. In particular, the build-up boards are advantageous in that depressed parts 10 can be created on the surface of the boards with high machining accuracy. Hence, use of such build-up boards is particularly effective in cases where substrate electrodes 2 are closely placed on the boards so that the depressed parts 10 must be created with high accuracy.

Dimensions of the depressed part 10 depend on the sizes of the substrate electrodes 2 and a space (see double-headed arrow P of FIG. 2) between the substrate electrodes 2 opposite each other across the depressed part 10. For instance, if the space is 0.35 mm, the depressed part 10 can be given a width of 0.10 mm. Since inner layer wiring 2c of the substrate 1 is formed on the second layer or deeper, the depressed part 10 of the present embodiment is formed to be as deep (for example, 0.05 mm) as the first layer of the substrate 1. This makes it possible to form the depressed part 10 anywhere on the component side surface of the substrate 1 unless any substrate electrodes 2 or surface wiring are formed thereon. In addition, the substrate resist 3, provided on the substrate 1 after formation of the depressed part 10 thereon, prevents the inner layer wiring 2c from being exposed on the surface even if the inner layer wiring 2c is formed in the second layer, counted from the component surface, of the substrate 1.

Though the depressed part 10 is formed so as to enclose each group of 3×3 substrate electrodes 2 in the present embodiment, the invention should by no means be limited to this, and the number of the electrodes 2 thus enclosed by the depressed part 10 can be one or greater. Further, the depressed part 10 does not always need to surround such substrate electrodes 2. The depressed part 10 just needs to be formed anywhere on the substrate 1 unless it interferes with the substrate electrodes 2, the inner layer wiring 2c, and surface wiring arranged on the substrate 1.

The filling (hereinafter also called the "filling material" without making a clear distinction therebetween) 11 is made of a material, such as an epoxy resin, with rigidity higher than the rigidity of the substrate 1. The filling material 11 is directly applied to the depressed part 10 of the substrate 1 with a dispenser, thereby being filled into the depressed part 10.

Here, if the substrate 1 is a build-up board, the filling material 11 can be an epoxy resin with a Young's modulus of approximately 3500 N/mm² which hardens when heated at 150° C. for 10 minutes, or an epoxy resin with a bending elastic coefficient of 3000 to 5000 N/mm² which hardens when heated at 120° C. for 20 minutes, and an epoxy resin that hardens when heated at 180° C. for one minute, or that hardens concurrently with applied solder.

In this manner, partly since the depressed part 10 is formed so as to divide substrate electrodes 2 into groups (surrounding the groups of substrate electrodes 2), and partly since the depressed part 10 is filled with the filling material 11 with rigidity higher than that of the substrate 1, the rigidity of the substrate 1 is resultantly increased so that stresses applied to the substrate 1 by drop impact or the like are absorbed. As a result, even if the substrate 1 is dropped and impact stresses are applied thereto, probable damages such as cracks in joints (soldered parts) between the substitute and the component and exfoliation of the joints are prevented.

Further, even if solder, which has been applied by solder print to positions slightly shifted from the proper positions, spreads over the depressed part 10, the filling material 11, which is filled into the depressed part 10 so as to be flush or almost flush with the surface of the substrate 1, prevents the solder from flowing into the depressed part 10. This protects the printed solder from damages caused by such overflowed solder, and the rigidity of the substrate 1 is also maintained so that applied stresses can be absorbed. That is, the rigidity of the substrate 1 is improved to absorb applied stresses, with no necessity of improving the required accuracy in soldering processing.

As a modification of the present embodiment, the filling 11 can be made of a material, such as a silicon resin, with lower rigidity than that of the substrate 1. As a result, even if the substrate 1 is dropped, impact stresses thereby being applied to the substrate are absorbed by the material, and probable damages, such as cracks in joints (solder part) between the substrate 1 and the component 4 and exfoliation of the joints, are prevented without the necessity of improving the required accuracy in soldering processing.

Further, the filling material 11 can be made of a member having a thermal expansion coefficient intermediate between the thermal expansion coefficient of the material making up the component 4 and the thermal expansion coefficient of the material making up the substrate 1. This arrangement will absorb stresses applied to the component 4 and the substrate 1 which are caused by temperature change due to a difference in the thermal expansion coefficient between the component 4 and the substrate 1. That is, the filling material 11, which makes the thermal expansion coefficient of the substrate 1 approximate the thermal expansion coefficient of the component 4, prevents the substrate 1 from expanding or contracting more than the component 4, so that it is possible to prevent damages, such as cracks in joints (solder part) between the substrate and the component and exfoliation of the joints, which are caused by temperature change due to a difference in the thermal expansion coefficient between the component 4 and the substrate 1.

In this modification, assuming that the substrate 1 has a thermal expansion coefficient of 60 ppm/° C. and that the component 4 has a thermal expansion coefficient of 10 ppm/° C., the filling material 11 is preferably made of material whose thermal expansion coefficient is 30 ppm/° C. to 40 ppm/° C. That is to say, the material making up the filling material 11 preferably has a thermal expansion coefficient intermediate between the thermal expansion coefficient of the substrate 1 and that of the component 4.

Further, the filling material 11 of the present modification contains a predetermined amount of filler mixed therein to adjust the thermal expansion coefficient of the filling material 11. Thus, if the filling material 11 is made of a material with rigidity higher than that of the substrate 1 (for example, an epoxy resin) or a material with rigidity lower than that of the substrate 1 (for example, a silicon resin), a predetermined amount of filler can be mixed in with the filling material to adjust the thermal expansion coefficient of the filling material 11 to an intermediate value between the thermal expansion coefficient of the substrate 1 and that of the component 4. As a result, the filling 11 has rigidity higher or lower than the substrate 1, and it also has a thermal expansion coefficient intermediate between the thermal expansion coefficient of the substrate 1 and the thermal expansion coefficient of the component 4, so that both the stresses applied by drop impact or the like and the stresses caused by temperature change are concurrently absorbed. In consequence, the aforementioned two types of effects and benefits are achieved.

(2) Second Embodiment

Figure 3:
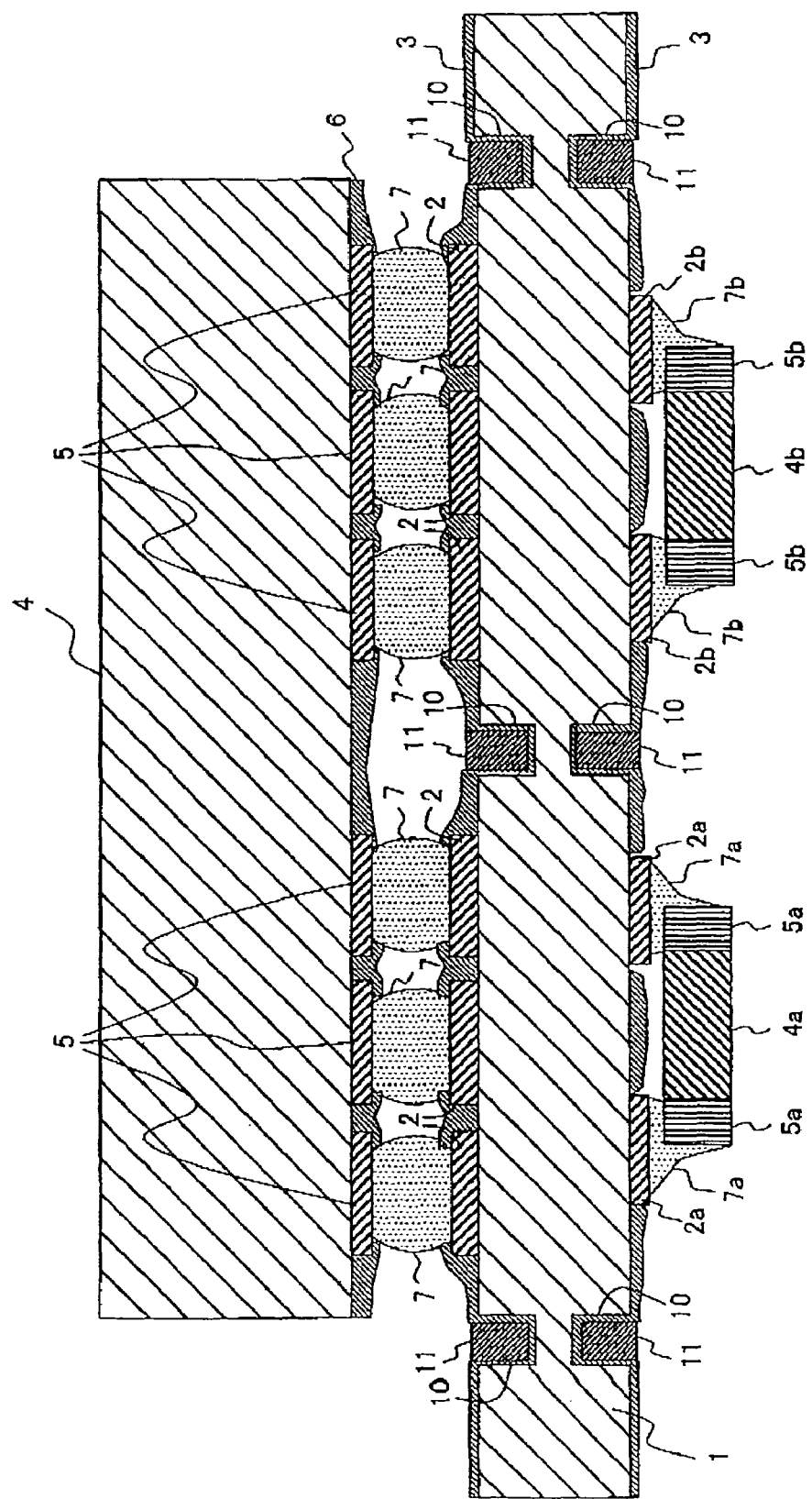
FIG. 3 is a cross-sectional view showing a substrate on which a component is mounted and a component mounting structure according to a second embodiment of the present invention.

Now, a description will be made hereinbelow of a component mounting substrate and a component mounting structure of a second embodiment. FIG. 3 is a cross-sectional view of the construction of the component mounting substrate and the component mounting structure of the second embodiment. Like reference numbers and characters designate similar parts or elements throughout several views of the present embodiment and the conventional art, so their detailed description is omitted here.

As shown in FIG. 3, in the component mounting substrate and the component mounting structure of the second embodiment, components, 4a and 4b, other than component 4 are mounted on a side thereof opposite the above-described component side. That is, the substrate 1 is formed such that components can be mounted on both sides thereof.

Concretely, the substrate 1 has substrate electrodes 2a and 2b for the components 4a and 4b, respectively, on the side thereof opposite the side on which the component 4 is mounted, and the components 4a and 4b have component electrodes 5a and 5b and solder joints 7a and 7b, respectively. The solder joints 7a and 7b are soldered to the substrate electrodes 2a and 2b, respectively, thereby connecting the substrate 1 and the components 4a and 4b.

As in the case of the foregoing component side, on which the component 4 is mounted, there are also formed depressed parts 10 on a side of the substrate 1 opposite the component side, and the depressed parts 10 are filled with filling material 11. Here, since both the depressed parts 10 and the filling material 11 are similar to those which are described in the first embodiment, their detailed description will be omitted here.

In this manner, according to the component mounting substrate and the component mounting structure of the present embodiment, like effects and benefits to those of the first embodiment will be realized. In addition, since the depressed parts 10 filled with the filling material 11 are formed on both sides of the substrate 1, stresses applied to the substrate 1 by drop impact or by temperature change are absorbed with higher reliability, so that probable damages, such as cracks in joints (solder part) between the substrate 1 and the component 4 and exfoliation of the joints, are prevented.

Figure 4:
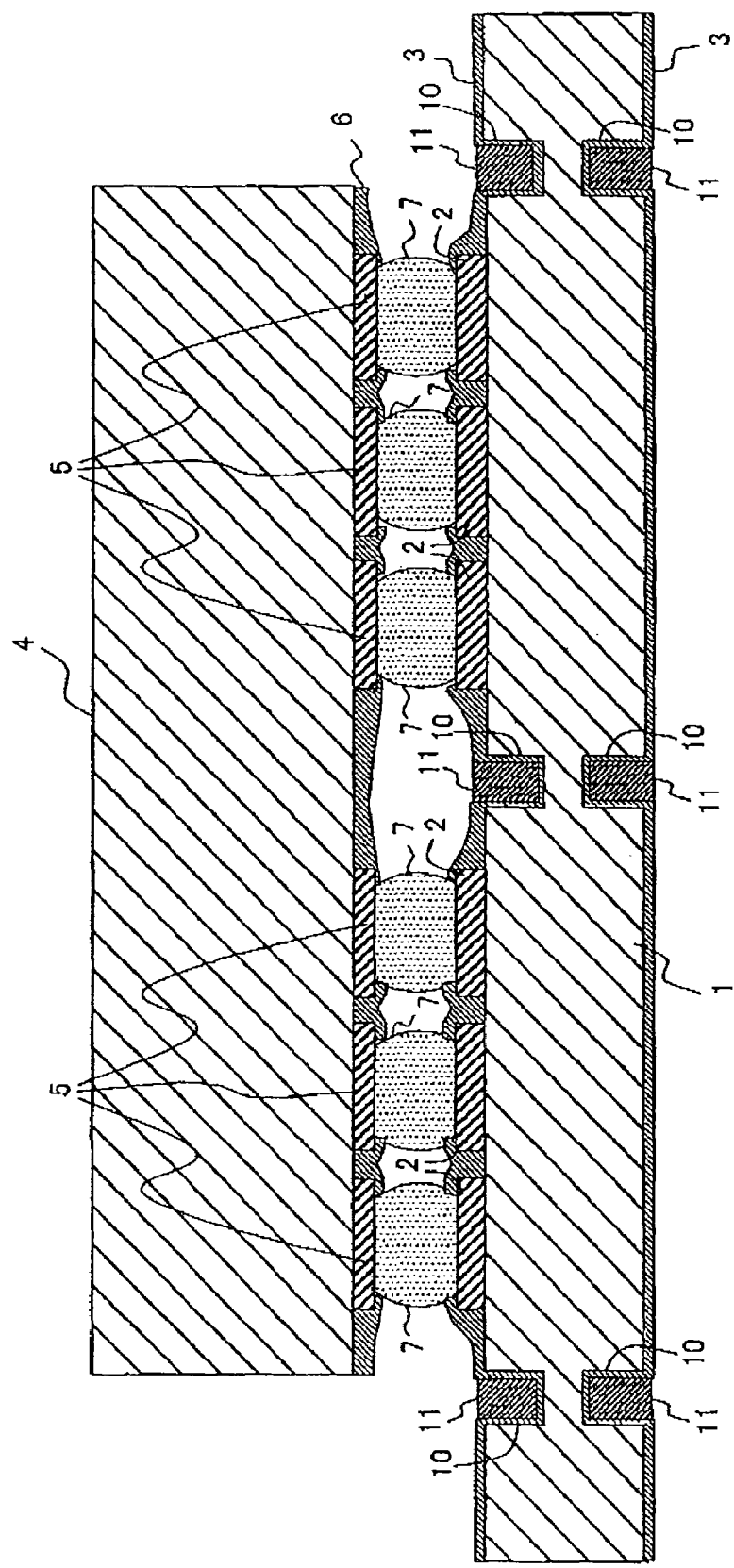
FIG. 4 is a cross-sectional view showing a substrate on which a component is mounted and a component mounting structure according to a modified example of the second embodiment of the present invention.

Further, as a modification of the second embodiment, even if there are no components arranged on the side of the substrate 1 opposite the side on which the component 4 is arranged (see FIG. 4), depressed parts 10 and filling material 11 are still preferably provided on the component-free side, whereby like effects and benefits to those of the second embodiment will be realized.

(3) Third Embodiment

Figure 5:
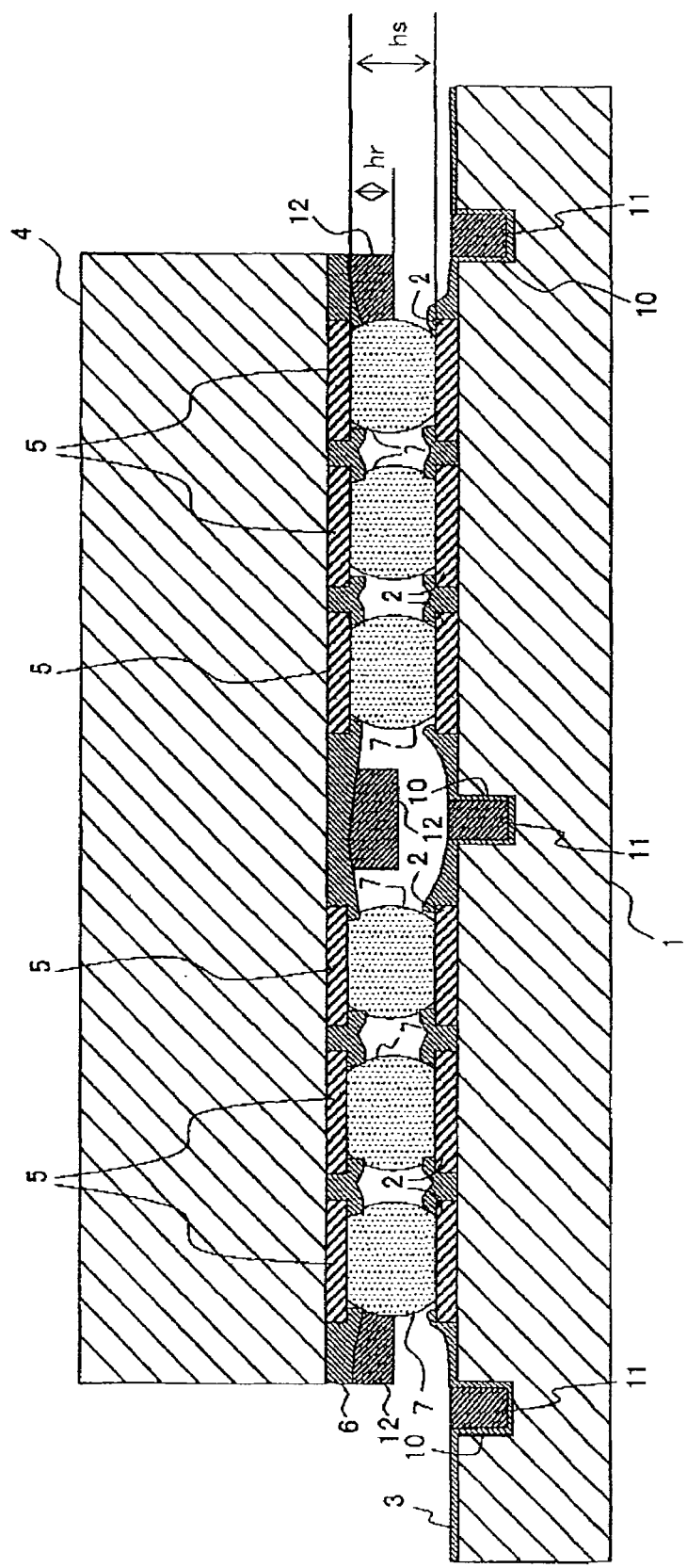
FIG. 5 is a cross-sectional view showing a substrate on which a component is mounted and a component mounting structure according to a third embodiment of the present invention.

Next, a description will made hereinbelow of a component mounting substrate and a component mounting structure of a third embodiment. FIG. 5 is a cross-sectional view of the construction of the component mounting substrate and the component mounting structure of the third embodiment. Like reference numbers and characters designate similar parts or elements throughout several views of the present embodiment and the conventional art, so their detailed description is omitted here.

As shown in FIG. 5, in addition to the above-described component mounting structure of the first embodiment, the structure of the third embodiment includes members (hereinafter will be called the "thermal expansion adjusting members") 12 provided on a side of the component 4 which faces the component side of the substrate, which members are made of material with a thermal expansion coefficient intermediate between the thermal expansion coefficient of the material making up the component 4 and that of the material making up the substrate 1. That is, the thermal expansion adjusting members 12 are directly attached to the component 4 on the side opposite to the substrate 1, avoiding areas in which component electrodes 5 are arranged.

The thermal expansion adjusting members 12 are similar to the filling material 11 of the first embodiment.

The members 12 are made of resin containing a predetermined amount of filler mixed therein to adjust the thermal expansion coefficient of the members 12.

Here, as shown in FIG. 5, the height hr of each thermal expansion adjusting member 12 needs to be smaller than the height hs of solder joints 7 to avoid soldering failures such as an open type or a bridging type.

In this manner, according to the component mounting substrate and the component mounting structure of the third embodiment, the thermal expansion adjusting members 12 realize like effects and benefits to those of the first embodiment where the filling material 11 has a thermal expansion coefficient intermediate between the thermal expansion coefficient of the component 4 and that of the substrate 1.

In particular, if the thermal expansion adjusting members 12 have a thermal expansion coefficient intermediated between the thermal expansion of the filling material 11 and that of the component 4, the above effects and benefits will be emphasized. Here, the thermal expansion adjusting members 12 can also have a thermal expansion coefficient intermediated between the thermal expansion of the material making up the component 4 and that of the material making up the substrate 1.

Figure 6:
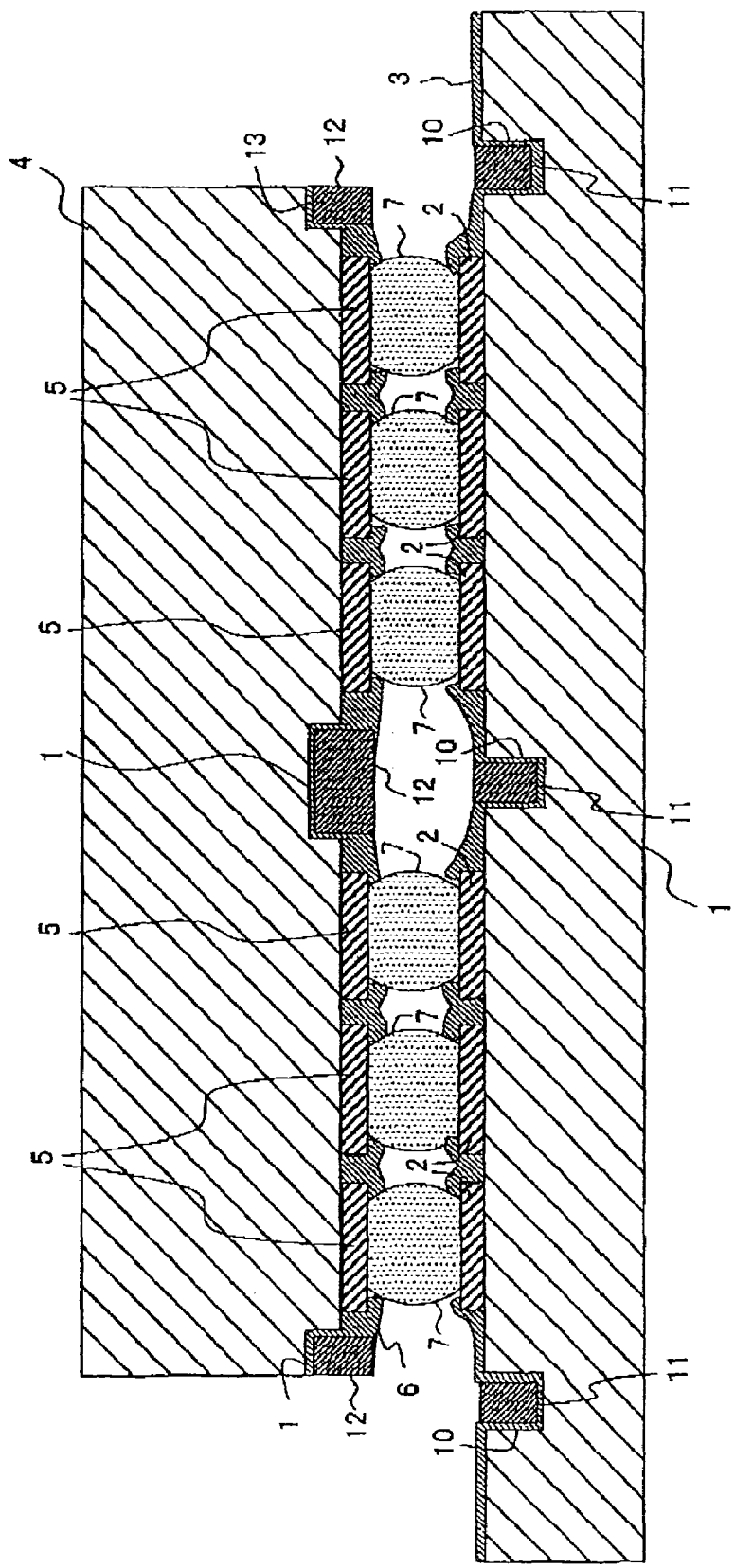
FIG. 6 is a cross-sectional view showing a substrate on which a component is mounted and a component mounting structure according to a modified example of the third embodiment of the present invention.

As a modification of the third embodiment, as shown in FIG. 6, a depressed part 13, similar to the depressed part 10 of the substrate 1 of the first embodiment, is formed on a side of the component 4 which faces the component side of the substrate 1, and the depressed part 13 is filled with a thermal expansion adjusting member 12. This arrangement also realizes like effects and benefits to those of the third embodiment.

Further, the material (for example, silicon resin) filled into the depressed parts 13 preferably has lower rigidity than that of the material making up the component 4, so that stresses applied to the substrate 1 by drop impact or by temperature change are absorbed with reliability, as in the case of the first embodiment where a member with rigidity lower than that of the substrate 1 is filled into the depressed parts 10. This will prevent probable damages, such as cracks in joints (solder part) between the substrate 1 and the component 4 and exfoliation of the joints.

(4) Other Modifications

The present invention should by no means be limited to the above-illustrated embodiment, and various changes and combinations may be suggested without departing from the gist of the invention.

For example, although the above embodiments employ a BGA package as a component mounted on the component mounting substrate and the component mounting structure, the invention is also applicable to LGA packages or the like, and like effects and benefits to those of the above-described embodiments will also be realized.

What is claimed is:

1. A substrate for mounting thereon a component having one or more solder joints, via which the component is adapted to be connected to the substrate, said substrate comprising:

a substrate body with a depressed part thereof formed within said substrate body on a component side thereof, on which side one or more electrodes are provided to come into close contact with the solder joints;

a filling made of a filling material with rigidity different from that of a material making up said substrate body, said filling being filled into the depressed part so as to be flush or almost flush with a surface of the substrate facing the component, wherein said filling is free of a bonding material to bond the substrate body to the component;

wherein said depressed part has a bottom surface comprised of said substrate body; and wherein at least a portion of said depressed part does not directly underlie the component.

2. A substrate as set forth in claim 1, wherein said substrate body has another depressed part formed on a side thereof opposite the component side, the last-mentioned depressed part being filled with a filling made of the filling material in such a manner that said filling is flush or almost flush with a surface of the opposite side.

3. A substrate as set forth in claim 1, wherein the depressed part is formed on the component side of said substrate body so as to surround one or more of the electrodes provided thereon.

4. A substrate as set forth in claim 1, wherein the filling material has rigidity higher than that of the material of said substrate body.

5. A substrate as set forth in claim 4, wherein the filling material is an epoxy resin.

6. A substrate as set forth in claim 1, wherein the filling material has rigidity lower than that of the material of said substrate body.

7. A substrate as set forth in claim 6, wherein the filling material is a silicon resin.

8. A substrate as set forth in claim 1, wherein a substrate resist is formed on the surface of the component side.

* * * * *